COMPOUND SEMICONDUCTOR DEVICES

Filed March 25, 1965

James O. McCaldin,
INVENTOR.
BY.
Charles S. Haughey
ATTORNEY.

United States Patent Office 3,266,952

Patented August 16, 1966

3,266,952

COMPOUND SEMICONDUCTOR DEVICES

James O. McCaldin, Los Angeles, Calif., assignor to Hughes Aircraft Company, Culver City, Calif., a corporation of Delaware

Filed Mar. 25, 1965, Ser. No. 442,667
3 Claims. (Cl. 148—33)

This application is a continuation-in-part of application Serial No. 42,878 filed July 14, 1960, now abandoned.

This invention relates to compound semiconductor devices, and more particularly to devices commonly known as III–V (Periodic Table Groups) compounded semiconductor containing impurity materials of Group IV elements such as silicon and tin.

It has been reported that compound semiconductor materials of the III–V type containing quantities of column IV material as impurity, such as germanium, tin and silicon have a characteristic conductivity type, with P-type or N-type, and accordingly for such compounds the column IV materials have been known as dopants. No mechanism for such doping has explained the doping characteristics so produced, and such characteristics are at best erratic and unpredictable as to apparent doping concentration and, at times, doping type.

The production of conductivity-determining types in compound semiconductors, such as gallium-arsenide, does not follow the same rules and procedures as for column IV (of the periodic table) semiconductor materials such as silicon and germanium. Doping of such III–V compound semiconductor crystals with column II or column VI element impurities is common practice today, as noted by Edmond, Proc. Phys. Rev., vol. 73, pt. 4, 622–7 (April 1959). This requires a double doping procedure, generally in independent steps, and presents many problems of unwanted chemical reactions, unwanted impurities, and complex material handling. This also makes it quite difficult to precisely control conditions to produce thin base transistor devices.

The doping of III–V compound semiconductors with elements from column IV has been studied in special cases, and has been reported in the literature as producing N-type conductivity in most cases, the IV element having a low doping efficiency. This has been interpreted to mean that more of the impurity atoms are located on the column III element sublattice than on the column V element sublattice of the semiconductor crystal. When III–V semiconductor compounds are produced in a standard procedure, their conductivity type is predictable, at least on the basis of prior experience.

According to the present invention, it is believed that the vacancies in the III and V element sublattices may be readjusted, and the relative positions in the sublattices of the III and V elements occupied by the IV element adjusted, by exposure of a column IV element doped III–V semiconductor crystal (whose constituent elements have substantially different vapor pressures) to a controlled temperature, time, and atmosphere pressure of the more volatile of the III and V elements. In every III–V compound presently under practical consideration, the V element is considerably the more volatile.

This invention provides compound semiconductor devices having PN junctions therein as a result of the apparent doping characteristics of column IV element impurities in each of the P and N-type regions. By way of example, this invention relates to gallium-arsenide semiconductor devices containing germanium as an impurity in both the P-type and N-type regions forming therein a PN junction. Other characteristics and advantages of this invention will be apparent from the balance of this disclosure and the preferred embodiment of the invention illustrated therein and in the accompanying drawing forming a part thereof, herein:

This invention is illustrated for the III–V semiconductor gallium-arsenide, doped with the column IV impurity germanium.

Figure 1:
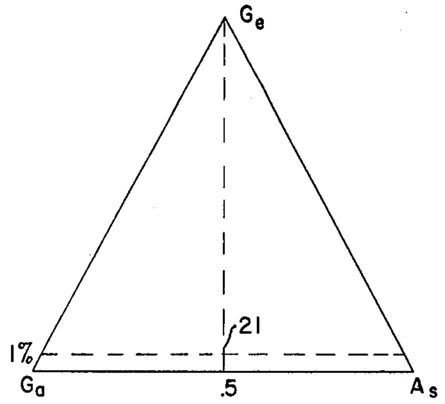
FIG. 1 is an incomplete three-element phase diagram.

Semiconductor crystals of gallium-arsenide have a nominal, or chemically determinable, composition as shown in FIG. 1, a partial phase diagram for the system gallium, arsenic, and germanium. Line 21 represents semiconductors at 0.5 (50 atomic percent) gallium, 0.5 arsenic, and 0 to over 1% germanium compositions. The gallium-arsenide semiconductor crystals fall on the 50% line, and the germanium dopant may be up to the solubility limit, which is at least 1%, although 0.01 to 1.1% is presently preferred. The curves 11 and 12 are schematic, and may not represent the actual shape of the true curves for the physical data.

In the system gallium-arsenic-germanium, the arsenic is relatively volatile with respect to gallium (and germanium). Although the proportions, for chemical purposes, of gallium and arsenic in the semiconductor crystal do not appreciably change with a change in arsenic pressure over a crystal, it has been found that, by apparent in-diffusion or out-diffusion of arsenic due to controlled vapor pressure and temperature, the conductivity type of the surface-adjacent crystal region may be changed. It is believed that the proportion of lattice vacancies is shifted by adding or removing arsenic atoms, and that germanium atoms then tend to redistribute between the sublattices of gallium and arsenic, thus changing the conductivity type of the crystal. Higher pressures $P_{As}$ of arsenic reduce the concentration of vacancies $V_{As}$ in the arsenic sublattice of the crystal, and by a transfer reaction which may be simplified as $$Ge_{Ga}+V_{As}=Ge_{As}+V_{Ga} \qquad (1)$$

where $Ge_{Ga}$ and $Ge_{As}$ are the germanium atoms in the respective gallium and arsenic sublattices.

A mass action relationship for equilibrium between vacancies and germanium atoms may be written:

$$\frac{N_{Ge_{Ga}}}{N_{Ge_{As}}}=K\frac{N_{VGa}}{N_{VAs}} \qquad (2)$$

where $N_{VAs}$, the concentration of vacancies in the arsenic lattice, depends upon the pressure of arsenic in the system $N_v \times P=K$ (for a monatomic gas), so Equation 2 above may be written in terms of gas pressures. At equilibrium, the gas pressures of As and Ga vary inversely, and $$\frac{N_{Ge_{Ga}}}{N_{Ge_{As}}}=\frac{P_{As}{}^{2\tau}}{P_{As_0}{}^{2\tau}} \qquad (3)$$

where the exponent $\tau$ is introduced to allow for non-monatomic gas (for arsenic $\tau=1/4$), and $P_{As_0}$ is the arsenic vapor pressure for which the impurity germanium atoms are equally distributed between gallium and arsenic vacancy sites. Thus a ten-fold change of arsenic vapor pressure over a gallium arsenide crystal from $P_0$ should make the surface region column IV impurity (germanium) an effective donor or acceptor dopant.

Figure 2:
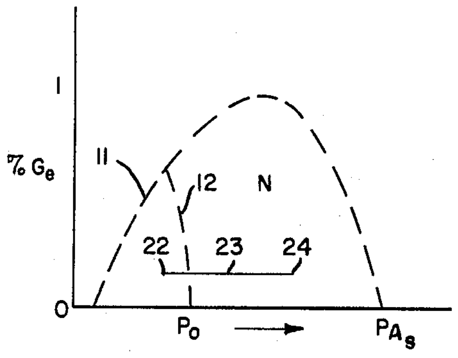
FIG. 2 is a diagram showing conductivity type as a function of arsenic partial pressure and germanium concentration at equilibrium in a gallium-arsenide semiconductor crystal.

As shown in FIG 2, the equilibrium conductivity type of a germanium doped gallium-arsenide semiconductor crystal changes on line 12 with the arsenic pressure. For this system, crystals prepared from a gallium-rich melt have an effective $P_0$ for arsenic of less than 1 atmosphere, and are P-type, hence $P_0$ is believed to be less than 1 atmosphere, although the precise pressure is not known. Different production techniques vary the effective atmosphere pressures, and a horizontal zone melting technique has been used to produce N-type material under 1 atmosphere arsenic vapor.

While FIG. 2 assumes a nominal gallium pressure has no substantial effect on the system, due to the kinetics of the reactions, low gallium atmosphere pressure does have a slow, surface effect. This is known as a surface erosion of the crystal, and it is preferably suppressed by use of an inert gas blanket of 1 atmosphere argon with the arsenic vapor.

While accurate prediction of conductivity type and other impurity-connected properties is not always possible, it is a relatively simple matter to measure such properties, then to set conditions to change the conductivity type and thus to produce a PN junction. Dashed line 11 represents equilibrium limit to the P and N regions of the semiconductor crystal structure, and dashed line 12 represents the intrinsic values. The precise location of these lines is not exactly known.

A gallium-arsenide crystal having 1% germanium was produced by the Czochralski method of crystal drawing under 1 atmosphere arsenic vapor pressure. Thus the crystal fell schematically at point 22 in FIG. 2, in a P-type region of the diagram. A slice of the crystal was subjected to 70 hours at 1100° C. and at 5 atmospheres arsenic pressure. The surface of the crystal was converted to N-type, and the PN junction was from 30 microns to 70 microns below the exposed crystal surface. Thus in FIG. 2, the surface characteristic moved on line 23 to point 24 in the N region during the above high arsenic pressure treatment. Capacity vs. reverse bias measurements indicated linear grading for the doping, confirming a diffusion type process.

Figure 3:
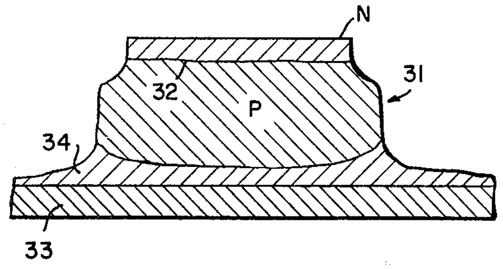
FIG. 3 is a sectional view of a diode made according to this invention.

FIG. 3 shows a diode made from a gallium-arsenide crystal slice of P-type, converted to N-type at the surface as above described. A crystal 31 having P and N regions and a junction 32 is bonded to a tantalum lead 33 by a gold bond 34.

Figure 4:
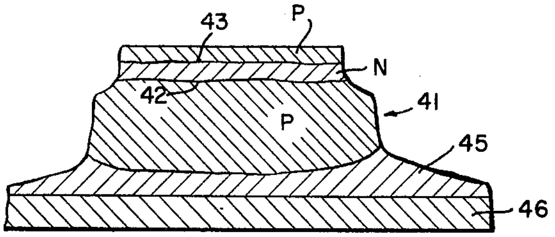
FIG. 4 is a sectional view of a transistor according to this invention.

FIG. 4 shows a similar transistor structure prior to etching a surface area for base lead attachment. A gallium-arsenide crystal 41 having PN junctions 42, 43 is bonded to a tantalum lead 46 by a gold bond 45.

To produce the transistor structure, a P-type crystal is subjected first to very high arsenic vapor pressure such as 5 atmospheres, then subsequently to a very low vapor pressure less than 0.1 atmosphere. The reconversion to P-type is preferably at a lower temperature to provide better control of diffusion depth. It will be appreciated that NPN structures may be produced from originally N-type crystals; and PN diodes from originally N-type crystals by out-diffusion under low arsenic vapor pressure.

The process of PN junction formation may be applied to a variety of III–V compounds. Commercially, or chemically, pure gallium-arsenide semiconductor material is believed to contain sufficient silicon, a column IV element, to accommodate the process herein described, and a chemically pure crystal of gallium-arsenide was type changed by the pressure adjustment process herein described.

Normal semiconductor production procedures for III–V compounds vary from compound to compound, primarily in the crystal pulling temperature and the ambient pressure of the V element atmosphere used. The V element atmosphere pressure used for normal crystal growing, called herein the normal crystal growing pressure, is, where attainable, the pressure of the V element which under stoichiometric conditions is in equilibrium with a 1 to 1 liquid solution of the III and V elements.

The normal crystal growing temperature will be the freezing temperature for the semiconductor material at the ambient pressure used, and will of course vary for a given semiconductor material as the pressure used varies from the stoichiometric normal pressure.

In a given normal crystal production process, the conductivity type will be affected by changes in the IV element used as an impurity, but will ordinarily be uniform for a given impurity through a range of concentrations. Thus, in the following Table I, Normal Growing Pressures (absolute) and Normal Growing Temperatures are given for various III–V semiconductor compounds, so far as presently known, and Normal Conductivity Types so produced with various impurities of column IV.

TABLE I

| III–V Compound | Normal Growing Pressure | Normal Growing Temperature, ° C. | Column IV Impurity | Normal Conductivity Type |
|---|---|---|---|---|
| In As | 0.3 Atmosphere of As | 936 | Si<br>Ge<br>Sn | N<br>N<br>N |
| In Sb | Below 1 micron Hg of Sb | 530 | Si<br>Ge<br>Sn | ?<br>P<br>N |
| In P | 15 to 60 Atmospheres of P | 1,060 | Si<br>Ge<br>Sa | ?<br>N<br>N |
| Ga As | 0.9 Atmosphere As | 1,240 | Si<br>Ge<br>Sn | N<br>N<br>N |
| Ga Sb | Less than 250 microns Hg (0.0003 Atm.). | 702 | Si<br>Ge<br>Sn | P<br>P<br>P |
| Ga P | Above 10 Atm | 1,450 | Si<br>Ge<br>Sn<br>C | N<br>?<br>?<br>? |

From the above Table I, taken with the discussion of FIG. 2, it should be readily apparent that a gallium-antimonide semiconductor having silicon, germanium or tin as a column IV impurity, will ordinarily be P-type conductivity as produced. It will be subject to conversion to N-type by subjection to a diffusion treatment in an ambient antimony vapor atmosphere considerably in excess of 0.0003 atmosphere and at a temperature sufficiently below 702° C. to maintain the semiconductor crystal structure, usually 100° to 300° C. below the freezing temperature. The depth of the N region formed by this treatment will, of course depend upon the temperature selected and the time of treatment.

Similarly, a semiconductor material of indium-arsenide having as a column IV impurity silicon, germanium or tin should be subject to conversion to P-type at an ambient arsenic atmosphere pressure substantially less than 0.3 atmosphere of arsenic and at a suitable temperature.

The pressure and temperature selected to convert P-type to N-type should not be so high as to change the semiconductor material to a liquid phase; and similarly, the pressure and temperature selected to convert N-type to P-type to a vapor phase. In other words, discretion must be used to avoid changing the semiconductor crystal phase before the conductivity type is changed.

It may be noted that the principles herein taught apply to other III–V semiconductors, such as aluminum-phosphide or aluminum-arsenide, although they are not attractive presently as semiconductor materials because of their hygroscopic properties; and indium-antimonide with tin as a predominant IV element impurity, which is unattractive because such low pressures would be required.

The doping characteristics of the devices according to this invention may be of lower concentration than desired in some applications. In such cases conventional doping materials for compound semiconductors such as the column II elements and the column VI elements may be used as additional dopants in the respective N and P regions. Such additional dopants may be of such value in the contact area to which leads are attached to avoid any disturbance of the conductivity type of such region during lead attachment. For example, zinc or cadmium from column II or sulphur or selenium from column VI may be used in the normal doping fashion to produce high doping concentration in a device adjacent the leads. Such elements may be present in the alloy material during the lead attachment bonding process to prevent a reversion of conductivity type to an undesired type of concentration. Similarly such doping impurity may be diffused or alloyed to the exposed face of a diode crystal prior to lead attachment. Opposite conductivity type dopant materials may be applied to opposed crystal surfaces in crystals already having a PN junction resulting from the effect of the column IV element as heretofore explained.

What is claimed is:

1. A III–V semiconductor crystal PN junction device having a substantially uniform impurity concentration of a column IV element, with a first region having a sufficient excess of said impurity in the III element sublattice to exhibit N-type conductivity and having a second region with a sufficient excess of said impurity in the V element sublattice to exhibit P-type conductivity, said crystal being essentially free from conductivity type determining impurities of columns II and VII in the region of the P-N junction.

2. A device according to claim 1 wherein said III–V crystal is a compound of the class consisting of:

| | |
|---|---|
| InAs | GaAs |
| InSb | GaSb |
| InP | GaP |

3. A device according to claim 1 wherein said column IV element is an element of the class consisting of silicon, germanium and tin.

References Cited by the Examiner

UNITED STATES PATENTS 2,928,761 3/1960 Gremmelmaier et al.

OTHER REFERENCES

Kolm et al.: Physical Review, vol. 108, 1957, pages 965–971.

Properties of Elemental and Compound Semiconductor Suterscience Publishers, New York, relied on August 31 to September 2, 1959 date, published 1960, pages 141–151 and 185–194.

DAVID L. RECK, *Primary Examiner.*

BENJAMIN HENKIN, *Examiner.*

C. N. LOVELL, *Assistant Examiner.*